United States Patent [19]
Baba et al.

[11] Patent Number: 5,936,282
[45] Date of Patent: *Aug. 10, 1999

[54] SEMICONDUCTOR DEVICE HAVING INPUT PROTECTION CIRCUIT

[75] Inventors: Takatsugu Baba; Takashi Ohsawa, both of Yokohama, Japan

[73] Assignee: Kabushiki Kaisha Toshiba, Kawasaki, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/843,965

[22] Filed: Apr. 17, 1997

Related U.S. Application Data

[63] Continuation of application No. 08/419,607, Apr. 10, 1995, abandoned.

[30] Foreign Application Priority Data

Apr. 13, 1994 [JP] Japan ................................. 6-074688

[51] Int. Cl.$^6$ .......................................... N01L 23/62
[52] U.S. Cl. ............................... 257/355; 257/356
[58] Field of Search ..................... 257/355, 356

[56] References Cited

U.S. PATENT DOCUMENTS

| | | | |
|---|---|---|---|
| 3,577,043 | 5/1971 | Cook | 317/235 R |
| 3,787,717 | 1/1974 | Fisher et al. | 317/235 R |
| 4,028,564 | 6/1977 | Streit et al. | 307/310 |
| 4,430,581 | 2/1984 | Mogi et al. | 307/296 R |
| 4,491,746 | 1/1985 | Koike | 307/296 R |
| 4,688,065 | 8/1987 | Kinoshita et al. | 357/23.13 |
| 4,698,655 | 10/1987 | Schultz | 357/23.4 |
| 4,739,437 | 4/1988 | Morgan | 361/88 |
| 4,757,363 | 7/1988 | Bohm et al. | 357/23.13 |
| 4,791,317 | 12/1988 | Winnerl et al. | 307/296 R |
| 4,829,350 | 5/1989 | Miller | 357/23.13 |
| 4,903,093 | 2/1990 | Ide et al. | 357/355 |
| 4,994,874 | 2/1991 | Shimizu et al. | 357/23.13 |
| 4,996,626 | 2/1991 | Say | 361/91 |
| 5,010,380 | 4/1991 | Avery | 357/23.13 |
| 5,016,078 | 5/1991 | Tailliet | 357/42 |
| 5,072,271 | 12/1991 | Shimizu et al. | 357/23.13 |
| 5,212,616 | 5/1993 | Dhong et al. | 361/18 |
| 5,212,618 | 5/1993 | O'Neill et al. | 257/356 |
| 5,386,135 | 1/1995 | Nakazato et al. | 257/369 |

FOREIGN PATENT DOCUMENTS

| | | |
|---|---|---|
| 0 324 185 | 7/1989 | European Pat. Off. . |
| 0 488 340 | 6/1992 | European Pat. Off. . |
| 27 22 892 | 12/1977 | Germany . |
| 55-72081 | 5/1980 | Japan . |
| 58-2061 | 1/1983 | Japan . |
| 58-121663 | 7/1983 | Japan . |
| 58-161375 | 9/1983 | Japan . |
| 59-111351 | 6/1984 | Japan . |
| 59-220946 | 12/1984 | Japan . |
| 60-107865 | 6/1985 | Japan . |
| 62-224057 | 10/1987 | Japan . |
| 63-137478 | 7/1988 | Japan . |
| 63-220564 | 9/1988 | Japan . |
| 01-286354 | 11/1989 | Japan . |

OTHER PUBLICATIONS

Momodomi et al., "A Circular Output Protection Device Using Bipolar Action," 25th Annual Proceedings—Reliability Physics, Apr. 1987, San Diego, California, U.S., pp. 169–173.

Patent Abstracts of Japan, vol. 18, No. 28 (P–1676), Jan. 17, 1994.

Patent Abstracts of Japan, vol. 12, No. 395 (E–671), Oct. 20, 1988.

*Primary Examiner*—Stephen D. Meier
*Attorney, Agent, or Firm*—Banner & Witcoff, Ltd.

[57] ABSTRACT

An input protection circuit is formed on a semiconductor substrate. A double well structure is formed by an impurity diffusion region and a protective circuit region containing the input protection circuit. A first potential setting source is connected to a separation region to set a predetermined potential, and a second potential setting source is connected to the semiconductor substrate to set a potential in the semiconductor substrate such that the separation region and the semiconductor substrate are reversely biased. Whereby, the semiconductor substrate including an internal circuit element and a peripheral circuit element is electrically isolated from the double well structure.

19 Claims, 6 Drawing Sheets

SEMICONDUCTOR DEVICE HAVING INPUT PROTECTION CIRCUIT

This application is a continuation of application Ser. No. 08/419,607 filed Apr. 10, 1995, now abandoned.

BACKGROUND OF THE INVENTION

1. Field of the Invention

The present invention relates to a semiconductor device having an input protection circuit for preventing an internal circuit element or a circuit element forming a peripheral circuit from being broken by static electricity charged onto an outer terminal of the semiconductor device.

2. Description of the Related Art

In a semiconductor device, there are usually provided input protection circuits in order to prevent breakage of an element of the inside of a chip. This problem may occur when a high voltage accidentally generated or static electricity charged on a human body is applied to an outer terminal. Or, the input protection circuits are provided in order to prevent a circuit element, which forms a peripheral circuit such as a MOS transistor or a memory cell, from being damaged or broken by introducing a carrier into a semiconductor substrate through a plurality of pads or bonding pads.

A semiconductor device has a plurality of pads, or bonding pads, to receive input signals from external devices, and to send output signals to external devices. Those pads are connected to loads with bonding wires. Each of the input protection circuits is provided for each of the bonding pads.

Figure 1:
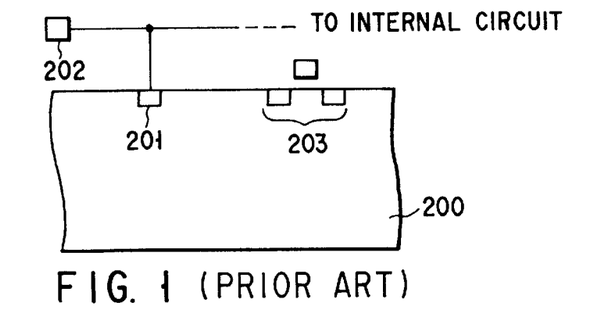
FIG. 1 is a schematic cross sectional view showing one example of a conventional input protection circuit.

FIG. 1 shows a conventional input protection circuit. An N conductivity type impurity diffusion region 201 is formed in a P conductivity type silicon substrate 200. An input pad 202 is connected to the N type region 201. Internal circuits including an N channel MOS transistor 203 are formed in the substrate. An interface between the P type substrate 200 and the N type region 201 forms a PN junction.

The following is a description of how the input protection circuit works. In a normal operation mode of the device, such as DRAM, the highest voltage which is applied to the pad 202 is the same as the one of logic high level "H", for example 3.3V. The PN junction is biased reversely, and no current flows therethrough. However, a sudden application of a high voltage, for example 10V, to the input pad 202 causes the PN junction to break down. Then, a current flows from the input pad 202 through the PN junction to the P type substrate 200, which prevents the high voltage from reaching the internal circuits. Therefore, the internal circuits are protected from a sudden application of a high voltage.

However, the conventional input protection circuit shown in FIG. 1 has a following problem.

In recent years, in accordance with improvement of a processing technique, miniaturization of a size of the element, or fining the element, there is a tendency for a withstand voltage against static electricity to be worsened. Particularly, in a semiconductor storage device such as a DRAM or an EEPROM, which is considerably made fine, improvement of such a withstand voltage against static electricity is an important subject.

SUMMARY OF THE INVENTION

An object of the present invention is to provide a semiconductor device having an input protection circuit, which can prevent breakage of an element of the inside of a chip or breakage of a circuit element forming a peripheral circuit even if static electricity, serving as a carrier, supplied to an outer terminal is introduced into an internal circuit of the semiconductor device or a peripheral circuit formed on a semiconductor substrate.

In order to attain the above object, according to the present invention, there is provided a semiconductor device having an input protection circuit.

More specifically, in the first aspect of the present invention, there is provided a semiconductor device having an input protection circuit comprising a semiconductor substrate of a first conductivity type; a separation region of a second conductivity formed on a part of the semiconductor substrate; a protection circuit forming region of a first conductivity formed on a part of the separation region and surrounded with the separation region, the separation region and the protection circuit forming region forming a double well; a diffusion layer of a second conductivity type formed on the protection circuit forming region; a first pad connected to the diffusion layer, an internal circuit element of the semiconductor substrate, and a circuit element of a peripheral circuit; a second pad connected to the separation region; first potential setting means, connected to the second pad, for setting a predetermined potential; and second potential setting means for setting a potential in the semiconductor substrate such that the separation region and the semiconductor substrate are reversely biased; wherein the semiconductor including the internal circuit circuit element and the circuit element of the peripheral circuit is electrically isolated from the double well.

In the second aspect of the present invention, there is provided an input protection circuit formed on a semiconductor substrate comprising a parasitic diode constituted by a PN junction of an impurity diffusion region and one well of a double well formed in the substrate; a bipolar transistor consisting of an impurity diffusion region and a double well region formed in the substrate; and an input pad connected to the parasitic diode and the bipolar transistor.

In the third aspect of the present invention, there is provided a semiconductor device comprising a signal input pad for receiving an externally supplied input signal; an input protection circuit connected to the signal input pad; a reference voltage generation circuit for generating a reference voltage; and a comparison circuit connected to the input protection circuit and the reference voltage generation circuit for comparing the signal and the reference voltage; wherein the reference voltage generation circuit and the input protection circuit are electrically isolated by a double well.

In the fourth aspect of the present invention, there is provided a semiconductor device comprising a first rectangular core block having a plurality of memory cells arranged in matrix; a second rectangular core block having a plurality of memory cells arranged in matrix; and a circuit block located between the first and second rectangular core blocks, the circuit block comprising a plurality of pads arranged in line; a plurality of input protection elements arranged in line beside the pad; a signal bus arranged beside the pads and the input protection elements; and a potential supply members connected to the signal bus and the protection elements.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Embodiments of the present invention will be explained with reference to the drawings.

Figure 2:
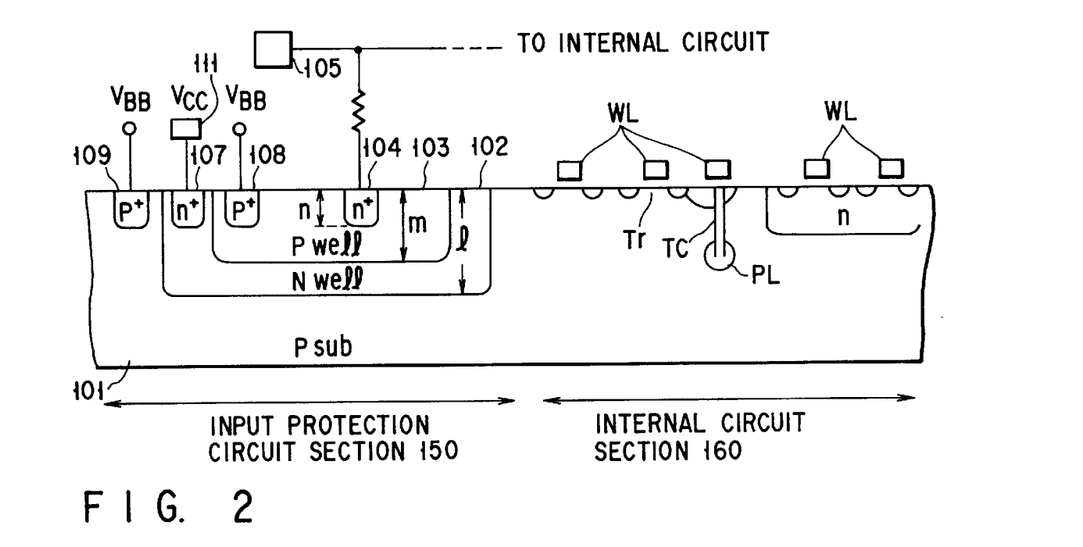
FIG. 2 is a cross sectional view showing a first embodiment of an input protection circuit of a semiconductor device of the present invention.

FIG. 2 shows a first embodiment of an input protection circuit 150, which is separated from an internal circuit 160 with a double well structure.

As shown in FIG. 2, an N type isolation region, that is, an N well 102 is formed on a part of a P type semiconductor substrate 101, a P type protection circuit forming region, which is surrounded with an N well, that is, a P well 103 is formed on a part of the N well 102, and an N$^+$ diffusion layer 104 is formed on the P well 103. The diffusion layer 104 is connected to, for example, a MOS transistor forming a signal input pad 105 connected to an outer terminal and an internal circuit.

A power supply pad 110 where VBB, serving as a negative potential, is supplied through a P$^+$ diffusion layer 108, is connected to the P well 103. In other words, the negative potential VBB is supplied to the P well 103.

Also, a power supply pad 111 where VCC, serving as a positive potential, is supplied through an N$^+$ diffusion layer 107, is connected to the N well 102. In other words, the positive potential VCC is supplied to the N well 102.

Moreover, a power supply pad 112 where VBB, serving as a negative potential, is supplied through a P$^+$ diffusion layer 109, is connected to a P type semiconductor substrate 101. In other words, the negative potential VBB is supplied to the P type semiconductor substrate 101.

It is noted that the VBB generator is connected to the power supply pads 110 and 112 (not shown in FIG. 2).

Figure 3:
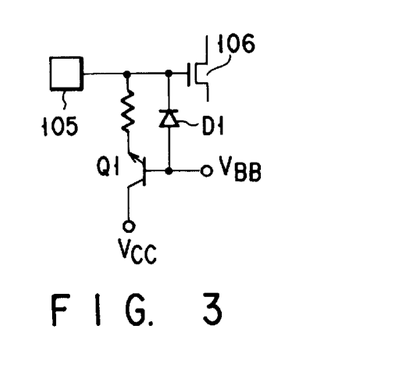
FIG. 3 is a view showing an equivalent circuit of the input protection circuit of FIG. 2.

FIG. 3 is an equivalent circuit of the input protection circuit shown in FIG. 2.

A parasitic diode D1 is formed by a PN junction of the N$^+$ diffusion layer 104 and the P well 103. Also, a parasitic NPN bipolar transistor Q1 (hereinafter called "vertical bipolar transistor" since this transistor is formed in a direction of a depth of the semiconductor substrate) comprises the N$^+$ diffusion layer 104, the P well 103, and the N well 102.

Figure 4:
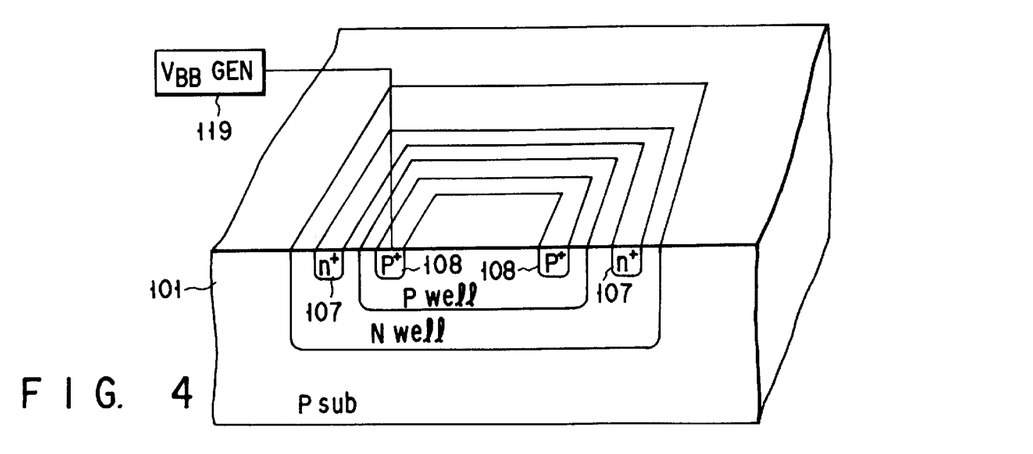
FIG. 4 is a perspective view of the input protection circuit of FIG. 2.

In FIG. 2, the N$^+$ diffusion layer 107 and the P$^+$ diffusion layer 108 are formed at only the left portion of the N well 102 and the P well 103, respectively. However, as shown in FIG. 4, these diffusion layers may be formed to surround the wells to equalize the potential distribution of the well, respectively.

In the above-mentioned structure, the carrier, which is supplied to the outer terminal by the static electricity, is absorbed by the N well 102, which functions as a collector of the bipolar transistor. However, since the relationship between the N well 102 and the P type semiconductor substrate 101 is a reverse bias, the introduction of the carriers from the N well 102 to the semiconductor substrate 101 can be controlled. In other words, the P type semiconductor substrate 101 is electrically isolated from the input protection circuit. Therefore, there is an advantage in that the variation of the potential (substrate potential), which is provided to the semiconductor substrate by influence of the carrier, can be controlled. Also, there is an advantage in that the breakage of the peripheral circuit formed on the P type semiconductor substrate 101 or the element of the memory cell can be controlled.

In the vertical bipolar transistor, a junction area of base and emitter, that is, an area where the N well 102 and the P well 103 are junctioned becomes large as compared with the conventional technique. Due to this, there is an advantage in that an operation efficiency of an bipolar action can be increased without enlarging the area of the protection circuit.

A collector of the vertical bipolar transistor, that is, N well 102 is desirably a well whose impurity concentration is high as possible. In general, it is known that resistance of the impurity layer becomes high if impurity concentration is low. In the N well 102, as the N well 102 is separated from the N$^+$ diffusion layer 107, a voltage drop is generated. However, in a case where resistance of the well is low, the voltage effect can be ignored since no influence is exerted on the operation of the protection circuit. However, in a case where resistance of the well is high, the well 102 is in a forward state by a local voltage drop. Due to this, there is possibility that the carrier of the N well 102 will be introduced into the P type semiconductor substrate 101. Since a variation of the substrate potential is generated by the introduction of the carrier, impurity concentration of the N well 102 is preferably set to be high.

In a case where a well is formed of an actual device, impurity concentration of the well is not equal in the direction of the depth of the semiconductor substrate, and an unequal distribution having a certain distribution (a surface portion has a relatively high impurity concentration). In the case that the well is used as a collector of the vertical bipolar as in the present invention, the N well of the portion having a depth m or less (FIG. 2) is important as a function of the collector and the N well is separated from the N$^+$ diffusion layer 107. Due to this, the N well is set to be a portion where the voltage becomes the lowest by the voltage drop. Regarding the relationship of impurity concentration of the N well 102, a portion, which is deeper than the depth m of the junction surface of the P well 103 and N well 102, is preferably higher than the depth of the surface of the N well 102. In other words, impurity concentration of the N well is preferably set to satisfy the relationship as follows:

[Impurity concentration of surface]<[Impurity concentration of depth×($m \leq x \leq 1$)]

In order to obtain such a distribution of concentration, for example, it is useful to form the well by use of a high acceleration ion implantation in which an acceleration voltage is M [eV] level (M=1×10$^8$).

Moreover, if a base length of the vertical bipolar transistor (that is, m−n wherein m is a depth of diffusion of the P well 103 and n is a depth of diffusion of n$^+$ diffusion 104) is too long, there is possibility that the bipolar action is insufficient for a protection circuit.

In the experiment, it becomes clear that the bipolar action efficiently functioned as a protection circuit in the case that m−n was 3.8$\mu$ or less. Regarding the voltage to be supplied to each region, various variations can be considered. For example, the voltage to be supplied to the N$^+$ may be VSS.

Even in this case, the relationship between the N well 102 and the P type semiconductor substrate 101 is the reverse bias, so that the carrier can be prevented from being introduced into the substrate.

Moreover, the negative potential VBB, which is supplied to the P$^+$ diffusion layers 108, and 109 may be generated by a different VBB supply circuit. Normally, VBB is generated in the interior of the chip based on a predetermined voltage provided from the outer terminal. However, by separating the VBB supply circuit for supplying the voltage to the P well 103 from the VBB supply circuit for supplying the voltage to the P type semiconductor substrate 101, there can be obtained advantages in which the substrate potential to be provided to the outer terminal can be stabilized, and a setting value for preventing an input undershoot applied on the outer terminal can be determined independently from a back gate bias VBB of an NMOS.

Furthermore, a ground potential VSS may be supplied to the P$^+$ diffusion layer 108 through a ground pad, and the input undershoot can be largely clamped in a case where a negative excess potential flows into the outer terminal.

Moreover, the ground potential VSS may be supplied to the P$^+$ diffusion layer 108 and the N$^+$ diffusion layer 107. In this case, since the N well 102 and the P well 103 have the same potential, the carrier is slightly introduced thereto. However, there is no problem since the voltage is almost zero and can be ignored, and the the inverse relationship between the P type semiconductor substrate 101 and the N well 102 can be maintained.

Variations of setting the voltage to be supplied to each region can be used in the following embodiment.

Figure 5:
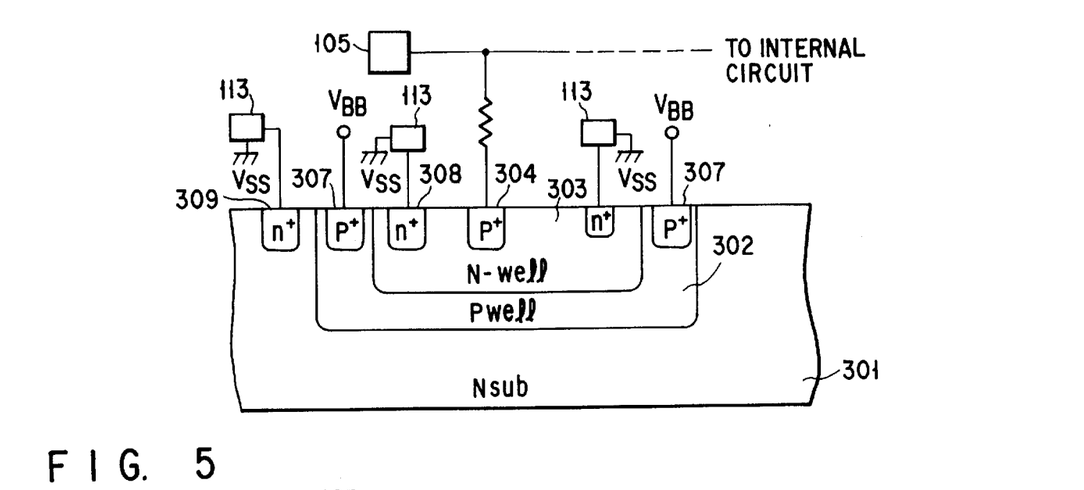
FIG. 5 is a cross sectional view showing a second embodiment of an input protection circuit of a semiconductor device of the present invention.

FIG. 5 is a cross sectional view showing a second embodiment of the input protection circuit of the semiconductor device of the present invention wherein an N type semiconductor substrate is used. The same reference numerals are added to the portions common to FIG. 2, and the explanation is omitted. It is noted that the internal circuit section of FIG. 2 is omitted.

The protection circuit device of this embodiment comprises a P type isolation region, which is formed on a part of an N type semiconductor substrate 301, that is, a P well 302, an N type protection circuit forming region, which is formed on a part of the P well 302 and surrounded with the P well, that is, an N well 303, and a P$^+$ diffusion layer 304 formed on the N well 303.

The diffusion layer 304 is connected to, for example, the MOS transistor (not shown) forming the signal input pad connected to the outer terminal 105 and the internal circuit.

A ground pad 113 where VSS, serving as a ground potential, is supplied to through an N$^+$ diffusion layer 308, is connected to the N well 303. In other words, the ground potential VSS is supplied to the N well 303.

Also, a power supply pad 110 where VBB, serving as a negative potential, is supplied through a P$^+$ diffusion layer 307, is connected to the P well 302. In other words, the negative potential VBB is supplied to the P well 302.

Moreover, a ground pad 113 where VSS, serving as a ground potential, is supplied through an N$^+$ diffusion layer 309, is connected to an N type semiconductor substrate 301. In other words, the ground potential VSS is supplied to the N type semiconductor substrate 301.

As mentioned above, the present invention can be applied to the N type semiconductor substrate, and the function and the advantage of this case are the same as the case of the P type semiconductor substrate.

Figure 6:
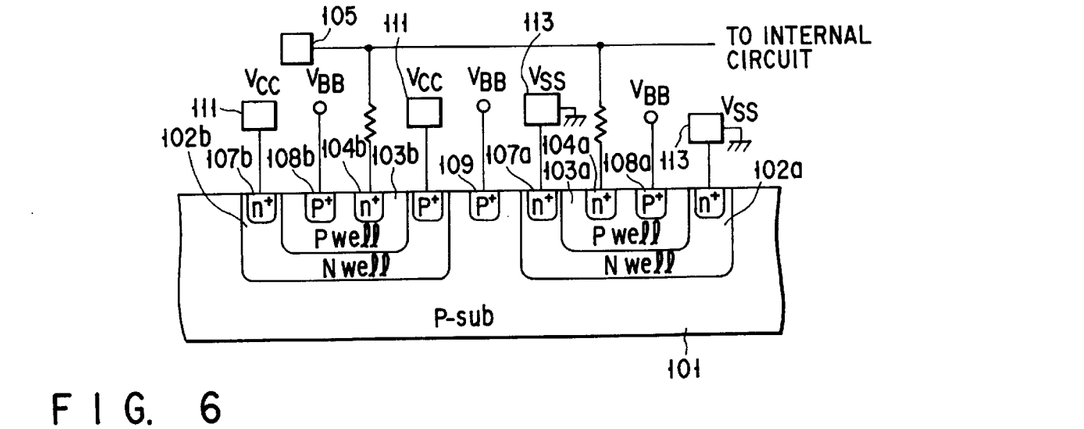
FIG. 6 is a cross sectional view showing a third embodiment of an input protection circuit of a semiconductor device of the present invention.

FIG. 6 is a cross sectional view of the input protection circuit of the third embodiment of the present invention.

The feature of this case is that two bipolar transistors for protection are provided, that is, a VSS system bipolar transistor and a VCC system bipolar transistor. The VSS system bipolar transistor comprises an N$^+$ diffusion layer 104a formed on the P type semiconductor substrate 101, a P well 103a, and an N well 102a to which the ground potential VSS is supplied. The positive potential VCC system bipolar transistor comprises an N$^+$ diffusion layer 104b, a P well 103b, and an N well 102b to which VCC is supplied. The reason of using the above two transistors is as follows.

In performing an ESD (electro static discharge) test under a MIL standard, it is considered that two types of tests, which are respectively a VSS reference and a VCC reference, are performed. In other words, the ESD test, which is based on the VSS reference, is performed in a state that a ground pad is set to 0V and the ESD test, which is based on the VCC reference, is performed in a state that an electrode pad is set to 0V. It is considered that ESD withstand voltage can be increased if any reference is selected.

Figure 7:
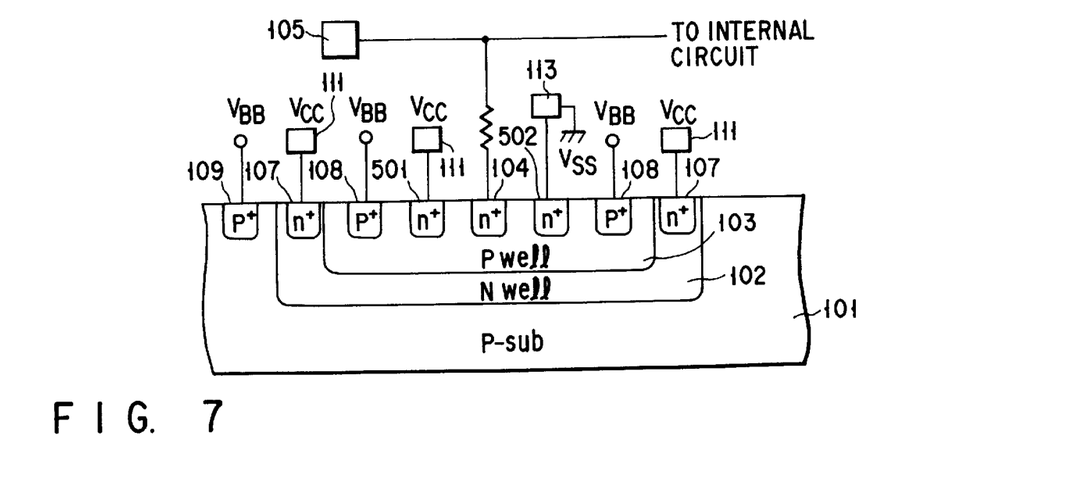
FIG. 7 is a cross sectional view showing a modification of the second embodiment of the input protection circuit of the semiconductor device of FIG. 6.

FIG. 7 is a cross sectional view of the protection circuit of a modification of the third embodiment of the present invention of FIG. 6. This modification is the same as the embodiment of FIG. 6 in that the VCC system and VSS system bipolar transistors are formed. However, the following points are different from the case of FIG. 6.

More specifically, the VCC system transistor has a bipolar transistor, which comprises the N$^+$ diffusion layer 104, the P well 103 and an N$^+$ diffusion layer 501 to which the positive potential VCC is supplied, and a bipolar transistor, which comprises the N$^+$ diffusion layer 104, the P well 103, and the N well 102 to which the positive potential VCC is supplied. Moreover, the VSS system transistor comprises the N$^+$ diffusion layer 104, the P well 103, and an N$^+$ diffusion layer 502 to which the ground potential VSS is supplied.

Figure 8:
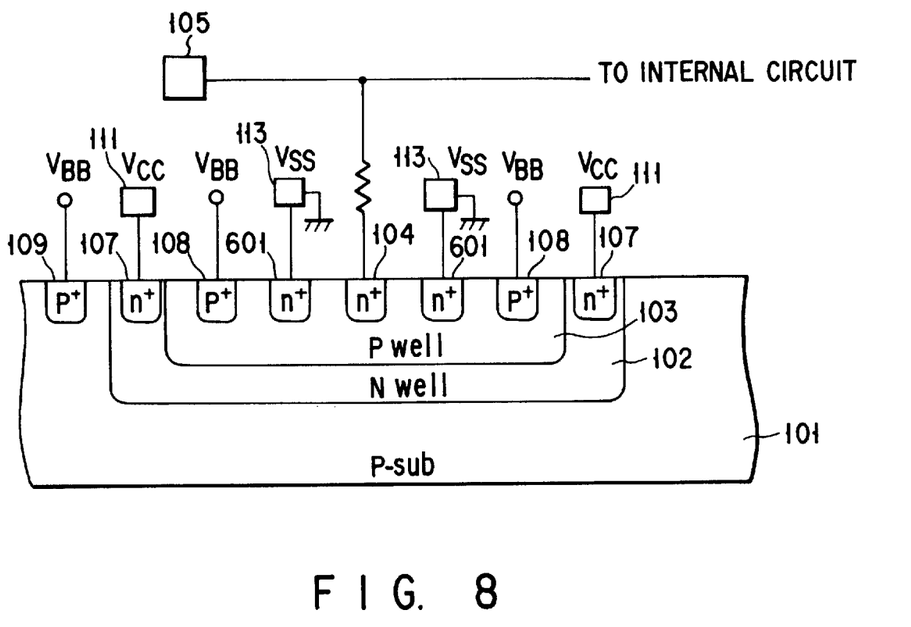
FIG. 8 is a cross sectional view showing another modification of the third embodiment of the input protection circuit of the semiconductor device of FIG. 6.

FIG. 8 is a cross sectional view of the protection circuit of another modification of the input protection circuit of the third embodiment of the present invention of FIG. 6.

The features of this modification are as follows.

The VCC system transistor comprises the bipolar transistor having the N$^+$ diffusion layer 104, the P well 103, and the N well 102 to which VCC is supplied. Also, the VSS system transistor comprises the N$^+$ diffusion layer 104, the P well 103, and an N$^+$ diffusion layer 601 to which the ground potential VSS is supplied.

The above embodiments were explained by use of the double wells. However, the protection circuit is not limited to the above embodiments, and various modifications can be considered. For example, N$^+$ is diffused onto the P type semiconductor substrate surface to form an N+ layer functioning as an isolation region on the substrate, and a P type epitaxial layer is formed thereon. The epitaxial layer is selectively separated by an N layer, and an N+ diffusion layer, which is connected to the outer terminal, is formed on the surface of the P type epitaxial layer (protection circuit forming region). Then, if the voltage as explained in the above-mentioned embodiments is supplied to each region, a vertical bipolar transistor can be formed. This structure can be mainly considered as a protection circuit of an IC of Bi-CMOS.

Figure 9:
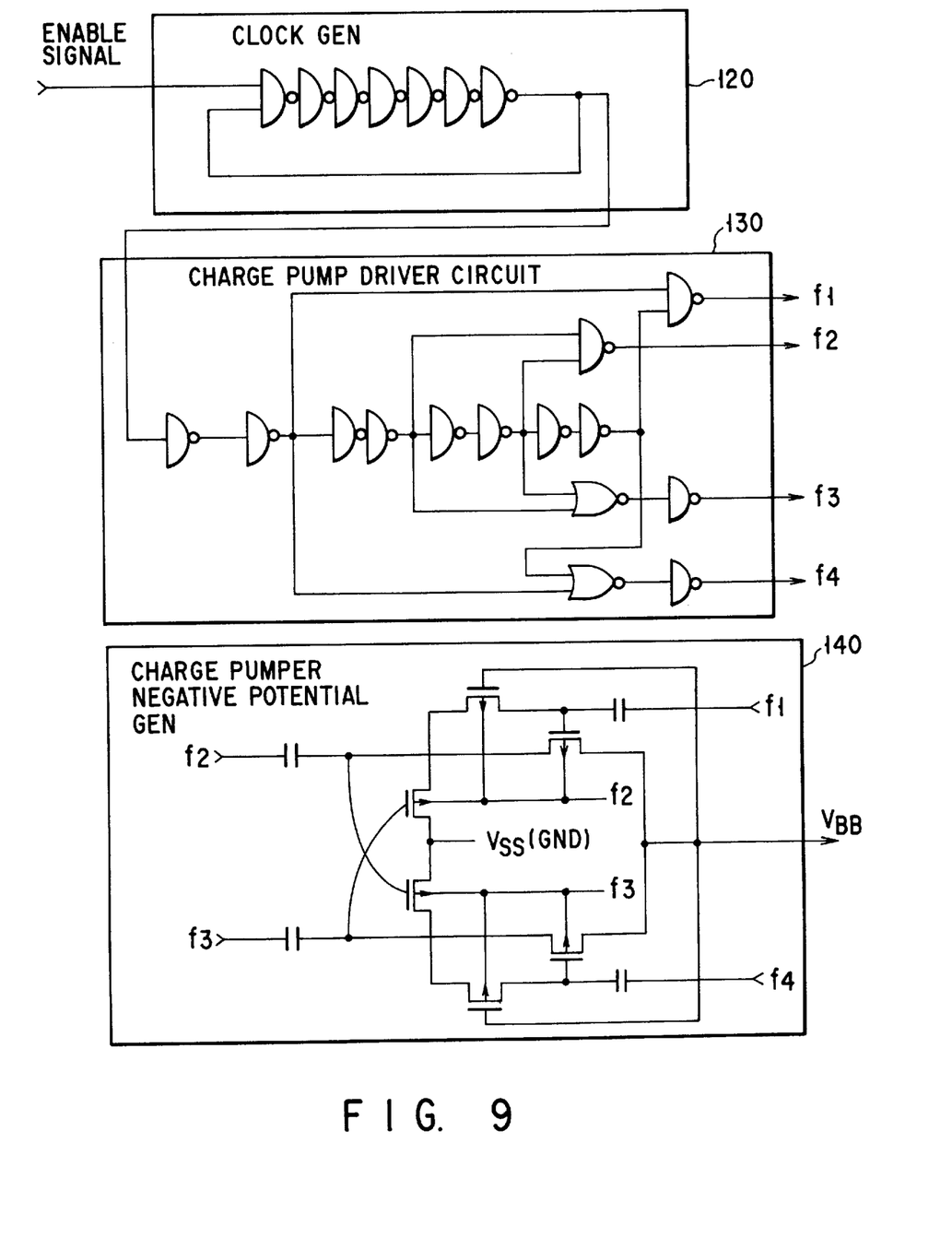
FIG. 9 is a circuit diagram showing an example of VBB generator used in the embodiment of the present invention.

In the each of the above-mentioned embodiments of the present invention shown in FIGS. 2 to 6, the negative potential VBB is generated by the VBB generator shown in FIG. 9.

In other words, on receiving enable signals, a clock generator 120 generates clocks. On receiving the clocks, a wave forming is performed by a charge pump driver circuit 130, thereafter drive waves $f_1$, $f_2$, $f_3$, and $f_4$ can be obtained. On receiving the drive waves $f_1$, $f_2$, $f_3$, and $f_4$, a complementary charge pumper negative potential generator 140 generates a negative potential VBB.

Figure 10:
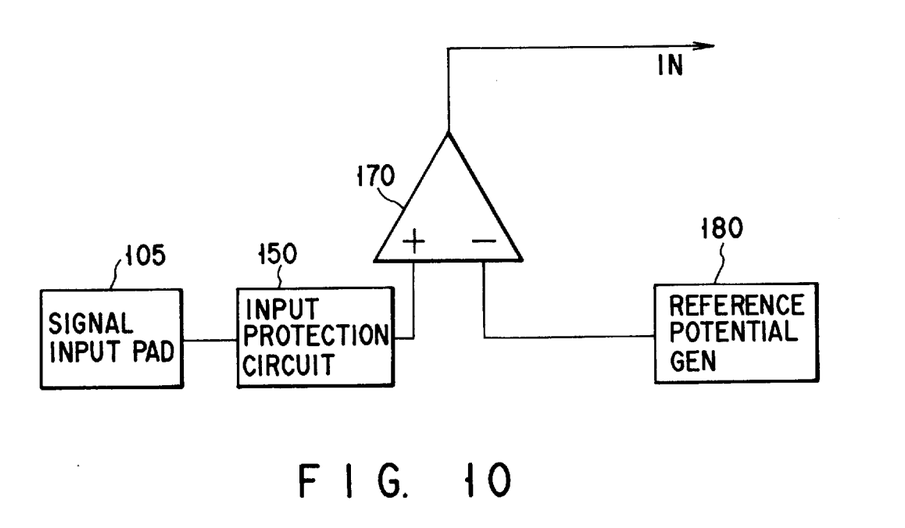
FIG. 10 is a circuit diagram showing one example of a VBB generator used in the embodiments of the present invention.

FIG. 10 shows a circuit diagram of one example of the input protection circuit of the first and second embodiments. The signal input pad 105 is connected to the input protection circuit 150, which is described above with FIGS. 2 to 6. A comparison circuit 170 of a current mirror type operational amplifier has two input terminals+ and −. The plus terminal is connected to the input protection circuit 150. The minus terminal is connected to a reference potential generation circuit 180, which generates a constant reference voltage. A signal IN is the output signal of the comparison circuit 170. Signal In corresponds to a potential applied to the pad 105.

Figure 11:
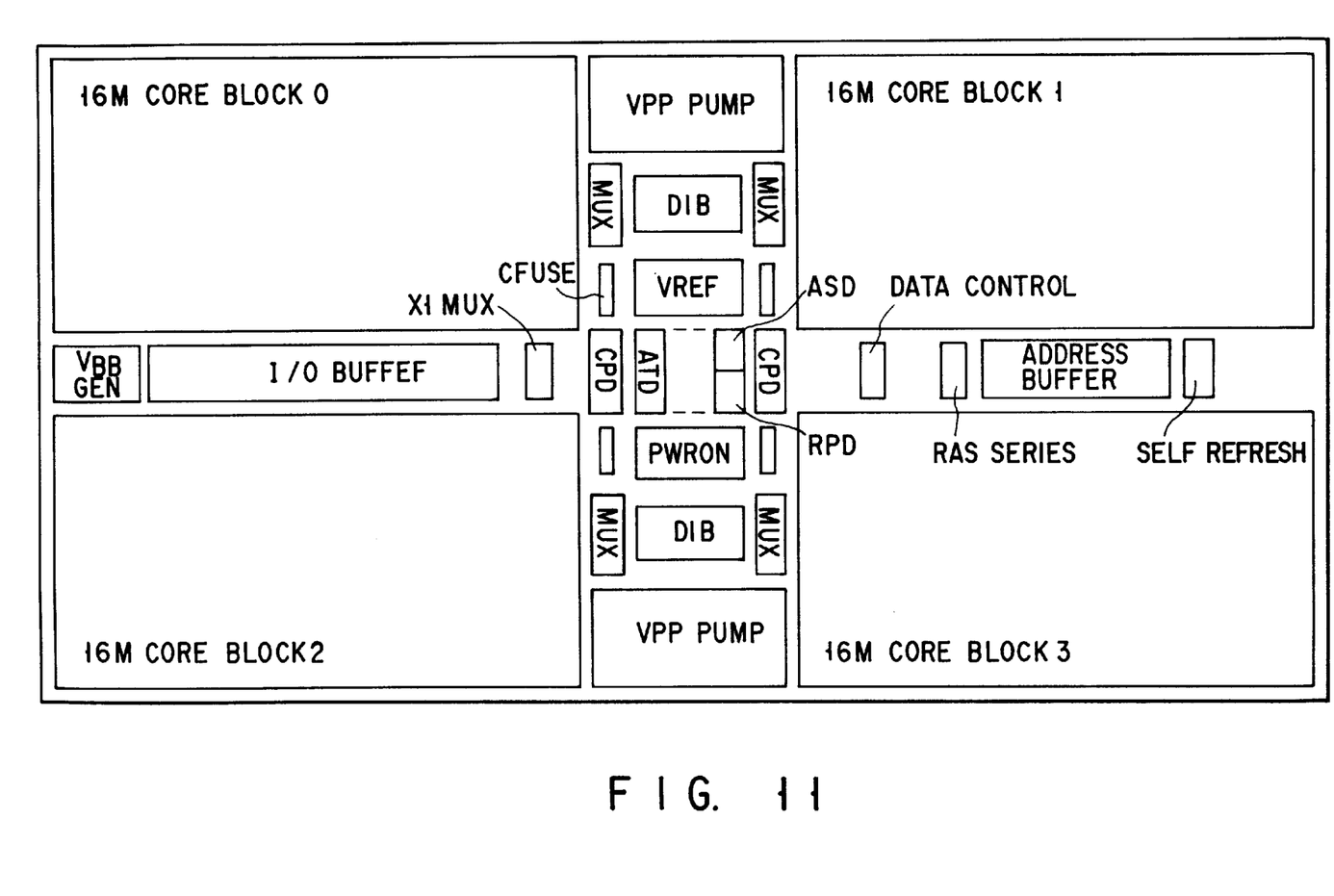
FIG. 11 is a circuit diagram of the input protection circuit of the embodiments of the present invention.

FIG. 11 shows a plane view of the semiconductor memory chip of the present invention. The 64 mega bits DRAM has four memory cell arrays (16M Core Block 0, 1, 2, and 3; hereinafter called CB0, 1, 2, and 3). Peripheral circuits are arranged between those core blocks. Between CB0 and CB1, and between CB2 and CB3, boosted potential generators (VPP Pump), data multiplexers (MUX), data-in buffers (DIB), fuses for column redundancy circuits (CFUSE), and reference potential generation circuits (VREF) are arranged. Between CB0 and CB2, an input and output buffer array (I/O Buffer) is inserted. Between CB1 and CB3, an address buffer array (Address buffer), and a row system control circuit (RAS series) are inserted.

Figure 12:
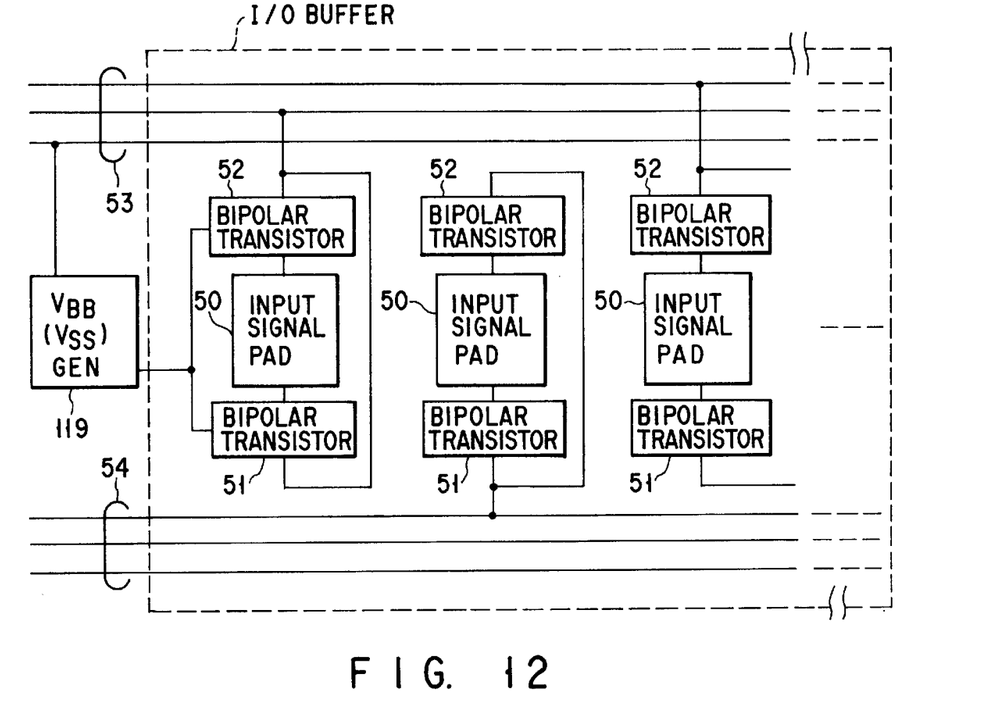
FIG. 12 is a detailed plane view showing the structure of an I/O buffer of FIG. 11.

Input and output buffers are arranged along an input signal and power supply pads array. FIG. 12 shows a detailed plane view of the input buffer circuits (I/O buffer, or Address buffer) used in the semiconductor memory chip shown in FIG. 11. A plurality of input signal pads 50 (address pads), each of which corresponds to input pad 105, are arranged in line. Input bipolar transistors 51 and 52 (or diodes) are arranged in line beside the pad 50. Data buses 53 and 54 run beside the array of the bipolar transistors 51 and 52. Those buses are connected to the transistors 51 and 52. A VBB generator (SSB) 119 is located at one end of the transistor array. One end of the VBB generator 119 is connected to the data bus 43 and the other end of which is connected to all of the bipolar transistors 51 and 52.

Figure 13:
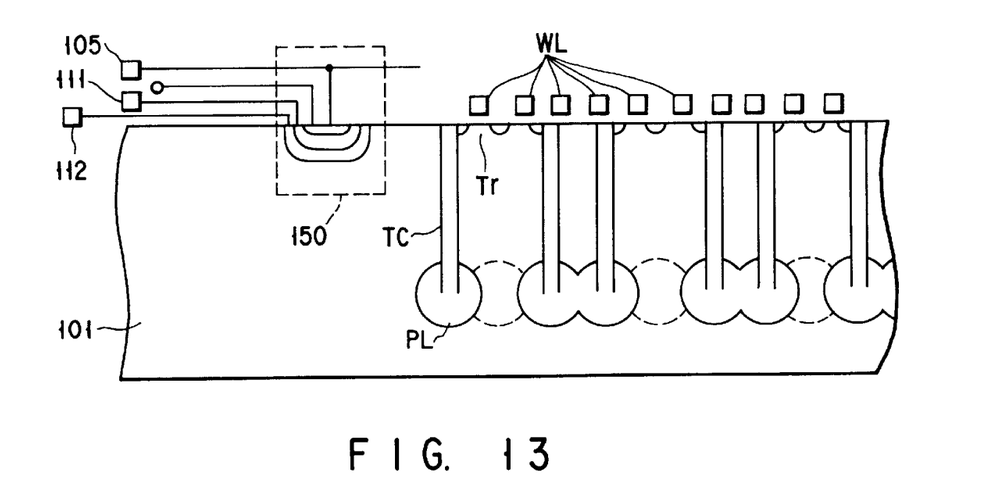
FIG. 13 is a cross sectional view of a memory cell used in a semiconductor memory chip of the present invention.

FIG. 13 shows a cross sectional view of memory cells used in the semiconductor memory chip of this invention. Each of the DRAM cells consists of one transistor (Tr) and one capacitor (TC). The capacitor is formed in a trench of the semiconductor substrate. The cells have a buried plate electrode structure. The plate electrodes of the capacitors (opposite electrode of a charge storage electrode which is connected to the transistor) are connected with each other by ball shaped N type diffusion regions located at bottoms of the trenches. Like a subway, the buried plate runs under the surface of the substrate, which provides a relatively planer surface.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. An input protected semiconductor device comprising:
   a semiconductor substrate of a first conductivity type;
   an internal circuit formed in said semiconductor substrate;
   an input protection circuit for protecting said internal circuit, said protection circuit comprising a parasitic transistor formed by:
   a first collector region of a second conductivity type formed in said semiconductor substrate;
   a base region of the first conductivity type formed within said collector region; and
   an emitter region of the second conductivity type formed within said base region;
   a signal input terminal connected to said internal circuit for receiving an externally supplied signal, said signal input terminal also being connected to said emitter region; and
   biasing means connected to said substrate, said collector region and said base region, for maintaining (1) a reverse bias across a junction of said substrate and said collector region and (2) a reverse bias across a junction of said collector region and said base region, whereby a double barrier is created suppressing a flow of carriers from said input terminal to said semiconductor substrate 2. An input protected semiconductor device according to claim 1, wherein the first conductivity type is P type and the second conductivity type is N type, and said biasing means maintains the substrate and the base region at a potential lower than the potential of said collector region.

3. An input protected semiconductor device according to claim 1, wherein a junction between said base region and said emitter region constitutes a parasitic diode, and said emitter region, said base region, and said collector region constitute a vertical bipolar transistor.

4. An input protected semiconductor device according to claim 1, wherein the first conductivity type is N type, and the second conductivity type is P type, and said biasing means maintains the substrate and the base region at a potential higher than the potential of said collector region.

5. An input protected semiconductor device according to claim 4, wherein a junction between said base region and said emitter region constitutes a parasitic diode, and said emitter region, said base region, and said collector region constitute a vertical bipolar transistor.

6. An input protected semiconductor device according to claim 5, wherein said vertical bipolar transistor is a $V_{SS}$ system bipolar transistor.

7. An input protected semiconductor device according to claim 1, wherein said base region further includes a second collector region of the second conductivity type formed therein, wherein said emitter region, said base region and said second collector region constitute a first bipolar transistor, and said emitter region, said base region, and said first collector region constitute a second bipolar transistor, said first and second bipolar transistors constituting $V_{CC}$ system bipolar transistors; and said base region further includes a third collector region of the second conductivity type formed therein, wherein said emitter region, said base region and said third collector region constitute a $V_{SS}$ system bipolar transistor.

8. An input protected semiconductor device according to claim 1, wherein said base region further includes a second collector region of the second conductivity type formed therein, wherein said emitter region, said base region and said second collector region constitute a first bipolar transistor, and said emitter region, said base region, and said first collector region constitute a second bipolar transistor.

9. An input protected semiconductor device according to claim 1, wherein a concentration of impurity material of said first collector region above a junction surface of said base region and said first collector region is higher than that of a portion of said first collector region, which is deeper than the depth of the junction surface of said base region and said first collector region.

10. An input protected semiconductor device according to claim 1, wherein said internal circuit comprises at least one memory cell including a transistor and a capacitor being formed in a trench of the semiconductor substrate.

11. An input protected semiconductor device according to claim 10, wherein said memory cell has a buried plate electrode of the capacitor being connected by a ball shaped diffusion region.

12. An input protected semiconductor device according to claim 1, wherein the difference between the depth of the junction between said emitter region and said base region and the depth of the junction between said base region and said first collector region is less than 3.8 micrometers.

13. An input protected semiconductor device, comprising:

a semiconductor substrate of a first conductivity type;

an internal circuit formed in said semiconductor substrate;

an input protection circuit for protecting said internal circuit, said protection circuit comprising a pair of bipolar transistors collectively formed by:

a first collector region of a second conductivity type formed in said semiconductor substrate;

a second collector region of the second conductivity type formed in said semiconductor substrate;

a first base region of the first conductivity type formed in said first collector region, said first base region including a first emitter region of the second conductivity type; and a second base region of the first conductivity type formed in said second collector region, said second base region including a second emitter region of the second conductivity type, wherein:

said first emitter region, said first base region, and said first collector region constitute a first of said pair of bipolar transistors and, said second emitter region, said second base region, and said second collector region constitute a second of said pair of bipolar transistors;

a signal input terminal connected to said internal circuit for receiving an externally supplied signal, said signal input terminal also being connected to said first and second emitter regions; and biasing means connected to said substrate, said first and second collector regions, and said first and second base regions, for maintaining (1) a reverse bias across a junction of said substrate and said first collector region; (2) a reverse bias across a junction of said substrate and said second collector region; (3) a reverse bias across a junction of said first collector region and said first base region, and (4) a reverse bias across a junction of said second collector region and said second base region, whereby a pair of double barriers is created suppressing a flow of carriers from said input terminal to said semiconductor substrate.

14. An input protected semiconductor device according to claim 13, wherein the difference between the depth of the junction between said first emitter region and said first base region and the depth of the junction between said first base region and said first collector region is less than 3.8 micrometers, and the difference between the depth of the junction between said second emitter region and said second base region and the depth of the junction between said second base region and said second collector region is less than 3.8 micrometers.

15. An input protected semiconductor device according to claim 13, further comprising:

a first impurity region of the first conductivity type formed in said first base region through which said biasing means is connected to said first base region, said biasing means maintaining said first base region at a potential which is lower than ground potential;

a second impurity region of the first conductivity type formed in said second base region through which said biasing means is connected to said second base region, said biasing means maintaining said second base region at a potential which is lower than around potential;

a third impurity region of the second conductivity type formed in said first collector region through which said biasing means is connected to said first collector region, said biasing means maintaining said first collector region at a positive potential;

a fourth impurity region of the second conductivity type formed in said second collector region through which said biasing means is connected to said second collector region, said biasing means maintaining said second collector region at a positive potential; and a fifth impurity region of the first conductivity type formed in said semiconductor substrate through which said biasing means is connected to said substrate, said biasing means maintaining said substrate at a negative potential lower than ground potential.

16. An input protected semiconductor device, comprising:

a semiconductor substrate of a first conductivity type;

an internal circuit formed in said semiconductor substrate;

an input protection circuit for protecting said internal circuit, said protection circuit comprising a pair of bipolar transistors collectively formed by:

a first collector region of a second conductivity type formed in said semiconductor substrate;

a base region of the first conductivity type formed in said first collector region;

an emitter region of the second conductivity type formed in said base region;

a second collector region of the second conductivity type formed in said base region;

a first impurity region of the second conductivity type formed in said base region;

a second impurity region of the first conductivity type formed in said base region;

a third impurity region of the second conductivity type formed in said first collector region; and a fourth impurity region of the first conductivity type formed in said semiconductor substrate, wherein;

said emitter region, said base region, and said first collector region constitute a first of said pair of bipolar transistors and said emitter region, and base region, and said second collector region constitute a second of said pair of bipolar transistors;

a signal input terminal connected to said internal circuit for receiving an externally supplied signal, said signal input terminal also being connected to said emitter region; and biasing means (1) connected to said first collector region through said third impurity region, and to said second collector region, and maintaining those collector regions at a first positive potential, (2) connected to said base region through said second impurity region and maintaining the base region at a negative potential, (3) connected to the substrate through said fourth impurity region and maintaining said substrate at a negative potential, and (4) connected to the first impurity region and maintaining the first impurity region at ground potential, whereby a double barrier is created suppressing a flow of carriers from said input terminal to said semiconductor substrate.

17. An input protected semiconductor device according to claim 16, wherein the difference between the depth of the junction between said first emitter region and said base region and the depth of the junction between said base region and said collector region is less than 3.8 micrometers.

18. An input protected semiconductor device, comprising:

a semiconductor substrate of a first conductivity type;

an internal circuit formed in said semiconductor substrate;

an input protection circuit for protecting said internal circuit, said protection circuit comprising:

a $V_{CC}$ system transistor and a $V_{SS}$ system transistor, collectively formed by;

a first collector region of a second conductivity type formed in said semiconductor substrate;

a base region of the first conductivity type formed in first collector region an emitter region of the second conductivity type formed in said base region;

a second collector region of the second conductivity type formed in said base region;

a first impurity region of the first conductivity type formed in said base region;

a second impurity region of the second conductivity type formed in said first collector region; and a third impurity region of the first conductivity type formed in said semiconductor substrate, wherein;

said emitter region, said base region, and said first collector region constitute said $V_{CC}$ system transistor, and said emitter region, said base region, and said second collector region constitute said $V_{SS}$ system transistor;

a signal input terminal connected to said internal circuit for receiving an externally supplied signal, said signal input terminal also being connected to said emitter region; and biasing means, said biasing means being connected to (1) said second collector region and maintaining said second collector region at ground potential, (2) to said base region through said first impurity region and maintaining said base region at a negative potential, (3) to said first collector region through said second impurity region and maintaining said first collector region at a positive potential, and (4) to said semiconductor substrate through said third impurity region and maintaining said substrate at a negative potential, whereby a double barrier is created suppressing a flow of carriers from said input terminal to said semiconductor substrate.

19. An input protected semiconductor device according to claim 18, wherein the difference between the depth of the junction between said emitter region and said base region and the depth of the junction between said base region and said first collector region is less than 3.8 micrometers.

* * * * *